United States Patent
Borean et al.

(10) Patent No.: US 9,837,817 B2
(45) Date of Patent: Dec. 5, 2017

(54) AUTOMATIC SYSTEM FOR CONTROLLING APPLIANCES

(71) Applicant: Telecom Italia S.p.A., Milan (IT)

(72) Inventors: Claudio Borean, Turin (IT); Ennio Grasso, Turin (IT)

(73) Assignee: Telecom Italia S.p.A., Milan (IT)

( * ) Notice: Subject to any disclaimer, the term of this patent is extended or adjusted under 35 U.S.C. 154(b) by 104 days.

(21) Appl. No.: 14/764,630

(22) PCT Filed: Feb. 1, 2013

(86) PCT No.: PCT/EP2013/052047
§ 371 (c)(1),
(2) Date: Jul. 30, 2015

(87) PCT Pub. No.: WO2014/117861
PCT Pub. Date: Aug. 7, 2014

(65) Prior Publication Data
US 2015/0372485 A1    Dec. 24, 2015

(51) Int. Cl.
*G05D 11/00*    (2006.01)
*H02J 3/00*    (2006.01)
(Continued)

(52) U.S. Cl.
CPC ............ *H02J 3/00* (2013.01); *G01D 4/00* (2013.01); *G05B 13/021* (2013.01); *H04L 67/125* (2013.01); *H01L 2924/0002* (2013.01)

(58) Field of Classification Search
CPC ......... H02J 3/00; H04L 67/125; G05B 13/021
See application file for complete search history.

(56) References Cited

U.S. PATENT DOCUMENTS 8,087,025 B1    12/2011 Graupner
2014/0010422 A1*    1/2014 Piper .................. G06T 7/0028
382/128

FOREIGN PATENT DOCUMENTS

| EP | 2505967 A1 | 10/2012 | |
|----|----|----|----|
| GB | WO 2013104767 A1 * | 7/2013 | ............... H02J 3/14 |
| WO | 2009/097400 A1 | 8/2009 | |

OTHER PUBLICATIONS

Oct. 2, 2013—(WO) International Search Report and Written Opinion—App PCT/EP2013/052047.
(Continued)

*Primary Examiner* — Mohammad Ali
*Assistant Examiner* — Sheela S Rao
(74) *Attorney, Agent, or Firm* — Banner & Witcoff, Ltd.

(57) ABSTRACT

A system for managing house appliances supplied through a power grid is provided. Each house appliance operates according to at least one corresponding operative mode. Each operative mode comprises a sequence of operative phases. The system comprises at least one control unit interfaced with the house appliances for exchanging data. The at least one control unit collects power profile data comprising timing and electric power consumption data of each operative phase of each operative mode of the house appliances; generates a time schedule of the house appliances operations by distributing in time the execution of the operative phases thereof such that total power consumption of house appliances is kept under a maximum power threshold of the power grid; and controls the operation of the appliances based on the time schedule. The at least one control unit is configured to generate the time schedule by exploiting a Particle Swarm Optimization approach.

15 Claims, 7 Drawing Sheets

(51) Int. Cl.
 *H04L 29/08* (2006.01)
 *G01D 4/00* (2006.01)
 *G05B 13/02* (2006.01)

(56) References Cited

OTHER PUBLICATIONS

Baranski, M. et al., "Genetic algorithm for pattern detection in nialm systems", Systems, Man and Cybernetics, 2004 IEEE International Conference on IEEE, Piscataway, NJ, USA, vol. 4, Oct. 10, 2004, pp. 3462-3468, XP010773294.
Baskar, G. et al., "Security constrained economic load dispatch using improved particle swarm optimization suitable for utility system", International Journal of Electrical Power & Energy Systems, vol. 30, Issue 10, Dec. 2008, pp. 609-613, XP025669832.
Manzo, J. et al., "Evolutionary flight and enabling smart actuator devices", Proc. SPIE, vol. 6525, Active and Passive Smart Structures and Integrated Systems, Dec. 31, 2007, XP002713076.
Derin, O. et al., "Scheduling energy consumption with local renewable micro-generation and dynamic electricity prices." First Workshop on Green and Smart Embedded System Technology: Infrastructures, Methods, and Tools, Apr. 12, 2010, 17 pages.
Chechkin, A. et al., "Introduction to the theory of Lévy flights", Anomalous Transport: Foundations and Applications (2008): 129-162.
Kennedy, J. and Eberhart, R., Particle Swarm Optimization, Proc. of the IEEE Int. Conf. on Neural Networks, 1995, Piscataway, NK, pp. 1942-1948.
J. Sun, B. Feng, and W. Xu, Particle swarm optimization with particles having quantum behavior, IEEE Congress on Evolutionary Computation, pp. 325-331, 2004.
Wenbo Xu, Jun Sun and Bin Feng, Adaptive Parameter Selection of Quantum-Behaved Particle Swarm Optimization on Global Level, School of Information Technology, Southern Yangtze University, Wuxi, Jiangsu, China, 6 pages.
Samrat L. Sabat, Leandro dos Santos Coelho, Ajith Abraham, MESFET DC model parameter extraction using Quantum Particle Swarm Optimization, Microelectronics Reliability 49 (2009) 660-666.
Wei Fang, Jun Sun, Yanrui Ding, Xiaojun Wu, Wenbo Xu, A Review of Quantum-behaved Particle Swarm Optimization, School of Information Technology, Jiangnan University, No 1800, Lihu Avenue, Wuxi 214 122, China, Jun. 23, 2010, 21 pages.

\* cited by examiner

AUTOMATIC SYSTEM FOR CONTROLLING APPLIANCES

BACKGROUND OF THE INVENTION

Field of the Invention

The present invention relates to a system and a method for monitoring and controlling the electric power consumption of home appliances supplied by the line power.

Description of the Related Art

Nowadays, the management of the domestic electric power consumption is become a very complex issue.

Indeed, domestic electric power consumption is highly variable. Typically, during a working day, highest electric power consumptions mainly occur during morning and evening, while during weekends electric power consumption is more evenly distributed. Other factors may strongly influence the domestic power consumption, such as for example the holidays and seasons of the year. Moreover, if on one hand the domestic electric power demand has reached higher and higher peak levels, on the other hand environmental and economical reasons have brought to the diffusion of residential renewable electric power generation units, whose electric power generation capabilities fluctuates based on the weather conditions. The complexity of this scenario is further increased by the introduction of time-varying and dynamic electric power tariffs.

In order to efficiently manage the domestic electric power consumption so as to avoid overloads (i.e., to avoid that the maximum power threshold of the power grid is exceeded) and reduce the costs, all the abovementioned aspects should be taken into account. Since this is a very complex task, the introduction of a system capable of automatically managing the domestic power consumptions is strongly desirable.

International patent application WO2009/097400 discloses a system and a method for monitoring and controlling the power consumption of a power-consuming device. The system and method may connect to a power source and a power-consuming device, connecting the power-consuming device to the power source. The power usage of the power-consuming device may then be measured and monitored. This monitoring data may then be stored and optionally sent to a controlling device on a data network. The location of the power-consuming device may also be determined, recorded, and sent to a controlling device. The system may also control the power usage of the power-consuming device. In some cases, a remote server may connect multiple energy monitoring systems in order to gain additional efficiencies and foster a community-based social network.

In the paper "Scheduling energy consumption with local renewable micro-generation and dynamic electricity prices" by Onur Derin and Alberto Ferrante, GREEMBED 2010, a scheduling problem for household tasks is discussed, directed to help users save money spent on their energy consumption. A system model is presented, which relies on electricity price signals, availability of locally-generated power and flexible tasks with deadlines. A case study shows that cost savings are possible but fast and efficient solutions to the scheduling problem are needed for their real world use.

SUMMARY OF THE INVENTION

The Applicant has found that the above mentioned solutions known in the art are affected by drawbacks, and/or are not efficient.

The system disclosed in patent application WO2009/097400 does not provide for automatically optimizing the domestic electric power consumption. Moreover, the system of WO2009/097400 is not designed to prevent overloads.

The optimization method disclosed in the paper by Onur Derin and Alberto Ferrante is based on a brute-force approach, which involves the processing of a very large amount of data. Therefore, this method has to be carried out by hardware units provided with high computational resources. In any case, a method based on a brute-force approach such as the one proposed by Onur Derin and Alberto Ferrante requires a high amount of time to provide satisfactory results, and thus it is scarcely suitable to be used in dynamic scenarios, such as the management of domestic electric power consumption.

In view of the state of the art outlined in the foregoing, the Applicant has faced the problem of how to provide a system and a method for managing house appliances which is capable of automatically optimizing the domestic power consumption and preventing the occurrences of overloads in a relatively short time, without requiring high computational resources.

An aspect of the present invention relates to a system for managing house appliances supplied through a power grid. Each house appliance is adapted to operate according to at least one corresponding operative mode. Each operative mode comprises a sequence of operative phases. The system comprises at least one control unit interfaced with the house appliances for exchanging data. The at least one control unit is configured to: collect power profile data comprising timing and electric power consumption data of each operative phase of each operative mode of the house appliances; generate a time schedule of the house appliances operations by distributing in time the execution of the operative phases thereof in such a way that at any time the total power consumption of the house appliances is kept under a maximum power threshold of the power grid; and control the operation of the appliances based on the time schedule. The at least one control unit is configured to generate the time schedule by exploiting a Particle Swarm Optimization approach based on a nature-inspired evolutionary flight.

According to an embodiment of the present invention, the at least one control unit is configured to generate the time schedule based on a Quantum Particle Swarm Optimization approach exploiting a Lévy probability distribution.

According to an embodiment of the present invention, the at least one control unit is configured to generate the time schedule by: a) randomly generating a population of candidate time schedules within a search space comprising all the possible candidate time schedules; b) for each candidate time schedule of the population, calculating a corresponding cost by means of a cost function; c) moving the candidate time schedules in the search space based on the cost thereof with a Quantum Particle Swarm Optimization approach exploiting a Lévy probability distribution; and d) generating the time schedule based on the candidate time schedules.

According to an embodiment of the present invention, the at least one control unit is configured to select a candidate time schedule global best position in the search space among positions previously taken by all the candidate time schedules in the search space based on the cost thereof. For each candidate time schedule, the at least one control unit is configured to move the candidate time schedule by selecting a candidate time schedule personal best position in the search space among positions previously taken by such candidate time schedule in the search space based on the cost thereof, and moving the candidate time schedule based on the candidate time schedule global best position and based on its candidate time schedule personal best position.

According to an embodiment of the present invention, the at least one control unit is configured to move the candidate time schedule from a current position in the search space to a new position in the search space by calculating a personal attractor position in the search space based on the candidate time schedule personal best position and based on the candidate time schedule global best position, and setting the new position in the search space based on the personal attractor position and based on the difference between: a) the personal attractor position and b) the current position, multiplied by a random number with Lévy distribution.

According to an embodiment of the invention, the cost function of a candidate time schedule depends on the difference between the maximum power threshold of the power grid and a power consumption of the house appliances that would occur if the house appliances operated following the candidate time schedule.

According to an embodiment of the invention, the cost function of a candidate time schedule further depends on user preferences and/or on constraints imposed by the operative modes of the house appliances.

According to an embodiment of the invention, the at least one control unit is further configured to control the house appliances in order to reduce the power consumption of the currently active house appliances and/or to deactivate at least one of the currently active house appliances if the power consumption of the currently active house appliances is higher than a guard threshold lower than the maximum power threshold of the power grid.

According to an embodiment of the present invention, the at least one control unit is configured to sequentially drive the currently active house appliance to reduce the power consumption thereof and/or to sequentially deactivate them according to a priority list defined by the user and/or starting from the currently active house appliances consuming more power, until the power consumption of the currently active house appliances falls below the guard threshold.

According to an embodiment of the present invention, the house appliances are located in a domestic area, and the at least one control unit comprises a local control unit located in the domestic area wirelessly interfaced with the house appliance for exchanging data.

According to an embodiment of the present invention, the at least one control unit further comprises at least one remote control unit remotely connected with the local control unit. The at least one remote control unit is configured to generate at least one remotely generated time schedule, and the local control unit is configured to generate a locally generated time schedule. The time schedule is the selected between the at least one remotely generated time schedule and the locally generated time schedule based on the costs of the at least one remotely generated time schedule and of the locally generated time schedule.

Another aspect of the present invention relates to a method for managing house appliances supplied through a power grid. Each house appliance is adapted to operate according to at least one corresponding operative mode; each operative mode comprises a sequence of operative phases. The method includes collecting power profile data comprising timing and electric power consumption data of each operative phase of each operative mode of the house appliances; generating a time schedule of the house appliances operations by distributing in time the execution of the operative phases thereof in such a way that at any time the total power consumption of the house appliances is kept under a maximum power threshold of the power grid; and controlling the operation of the appliances based on the time schedule. The step of generating the time schedule includes exploiting a Particle Swarm Optimization approach based on a nature-inspired evolutionary flight.

According to an embodiment of the present invention, the step of generating the time schedule is based on a Quantum Particle Swarm Optimization approach exploiting a Lévy probability distribution.

According to an embodiment of the present invention, the generating the time schedule includes: a) randomly generating a population of candidate time schedules within a search space comprising all the possible candidate time schedules; b) for each candidate time schedule of the population, calculating a corresponding cost by means of a cost function; c) moving the candidate time schedules in the search space based on the cost thereof with a Quantum Particle Swarm Optimization approach exploiting a Lévy probability distribution, and d) generating the time schedule based on the candidate time schedules.

According to an embodiment of the present invention, the method further comprises selecting a candidate time schedule global best position in the search space among positions previously taken by all the candidate time schedules in the search space based on the cost thereof, and, for each candidate time schedule, moving the candidate time schedule by selecting a candidate time schedule personal best position in the search space among positions previously taken by such candidate time schedule in the search space based on the cost thereof, and moving the candidate time schedule based on the candidate time schedule global best position and based on its candidate time schedule personal best position.

According to an embodiment of the present invention, the moving the candidate time schedule from a current position in the search space to a new position in the search space includes calculating a personal attractor position in the search space based on the candidate time schedule personal best position and based on the candidate time schedule global best position, and setting the new position in the search space based on the personal attractor position and based on the difference between: a) the personal attractor position and b) the current position, multiplied by a random number with Lévy distribution.

A further aspect of the present invention relates to a computer program.

BRIEF DESCRIPTION OF THE DRAWINGS

These and other features and advantages of the present invention will be made evident by the following description of some exemplary and non-limitative embodiments thereof, to be read in conjunction with the attached drawings, wherein.

DETAILED DESCRIPTION OF EXEMPLARY EMBODIMENTS OF THE INVENTION

Figure 1A:
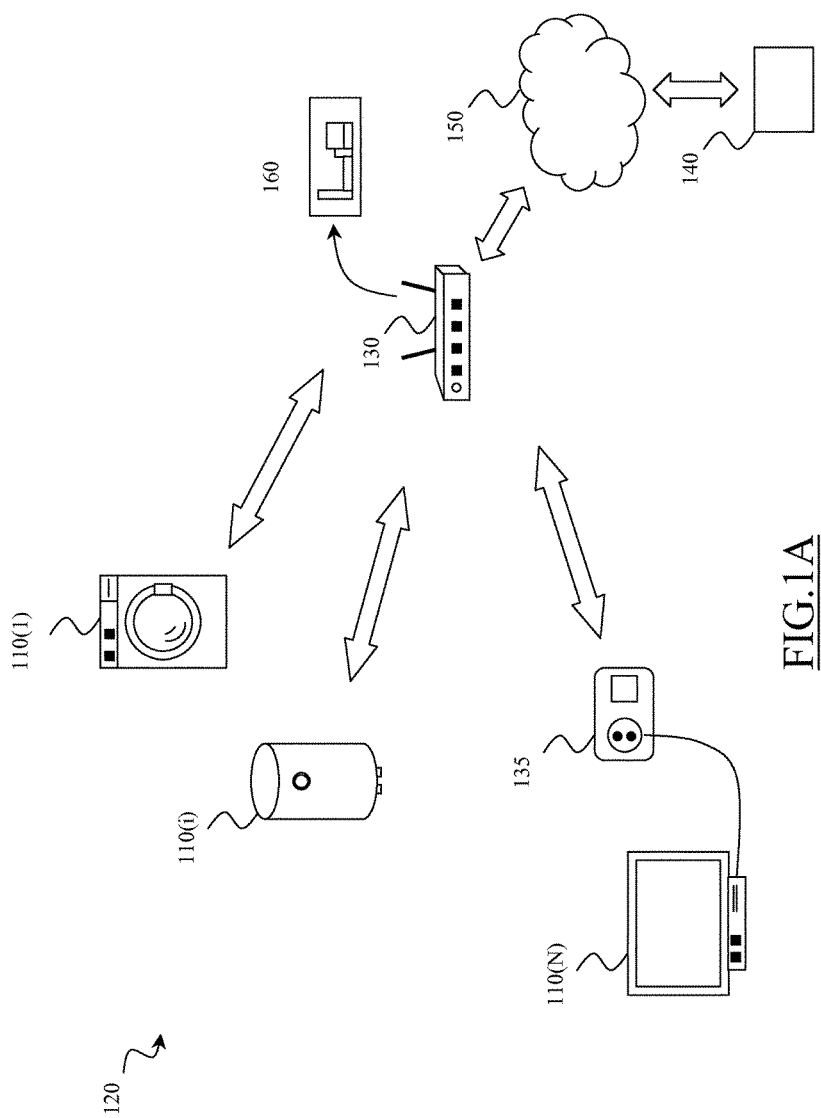
FIG. 1A illustrates a system for monitoring and controlling house appliances according to an embodiment of the present invention.

With reference to the drawings, FIG. 1A illustrates a system 100 for monitoring and controlling house appliances 110($i$) ($i$=1 to N) which are supplied by the line power provided by the power grid in a domestic area 120, such as a house, according to an embodiment of the present invention. A local control unit 130 is located in or in the proximity of the domestic area 120 for managing the operation of the system 100 by carrying out a power managing procedure which will be described in detail in the following of the description. For this purpose, the local control unit 130 is wirelessly interfaced with each house appliance 110($i$) for receiving therefrom data regarding its power consumption, and for correspondingly transmitting thereto commands for managing its operation.

The local control unit 130 may be located in a hardware processing unit, such as a domestic wi-fi station (e.g., an ADSL router), and the power managing procedure may be carried out by running an application and/or a software program locally stored in a memory of such processing unit and/or remotely available, for example through the Internet.

Similar considerations apply if different connections (wired and/or wireless) are exploited. Moreover, the local control unit 130 may have another structure, such as a dedicated and/or stand-alone hardware unit, or may comprise similar elements, such as cache memories temporarily storing the software program implementing the managing procedure.

Each house appliance 110($i$) may be a smart appliance, i.e., an appliance equipped with a communication interface adapted to exchange data with the local control unit 130, such as a wi-fi interface, a ZigBee interface, or a power-line interface, as well as with the capability of providing the local control unit 130 with the power profiles of its operative modes, and of being controlled in response to commands received by the local control unit 130. In the present document, the operative modes of an appliance are to be intended as the possible ways such appliance may operate. The complexity and the number of the operative modes of an appliance strongly vary based on the appliance type. For example, while an electric water heating typically has only one single operative mode, which provides for alternatively turning on and off the water heating resistance, a washing machine typically includes a wide range of different operative modes, each one corresponding to a particular washing program (e.g., cotton washing, wool washing and so on) with a particular set of input parameters (such as water temperature, presence or not of spin-drying and so on). The power consumption of each operative mode of the generic appliance is modeled by a corresponding power profile including a set of sequential energy phases, each one corresponding to a respective phase of the operative mode. For example, in a washing machine program, a phase may correspond to the water loading, another one to the drum spinning, and so on. Each energy phase is characterized by several parameters, such as the maximum power peak used in the phase, the time duration of the phase and the maximum allowable delay of the beginning of that phase after the end of the previous energy phase. By transmitting the power profile of the operative mode of an appliance to the local control unit 130, the latter is thus capable of estimating the power consumption of such appliance.

More traditional (i.e., non-smart) appliances, unsupplied with communication interfaces adapted to exchange data with the local control unit 130, and/or lacking of the capability of providing the local control unit 130 with the power profiles of its operative modes and/or of being remotely controlled, are connected to the power grid for receiving the line power through so-called smart plugs 135. Briefly, a smart plug is equipped with a measuring unit capable of operating power measurements on the appliance which are connected to a communication unit adapted to exchange data with the local control unit 130 and a relay unit adapted to control the appliance supply in response to commands received by the local control unit 130. Thanks to the presence of the smart plugs 135, the local control unit 130 is able to obtain information relating to the power usage of such appliances, and deducing an approximate power profile to be exploited by the power managing procedure.

As will be described in detail in the following of the present description, according to an embodiment of the present invention, the power managing procedure may be also carried out by a remote control unit 140 which is remotely interfaced with the local control unit 130, for example through a remote network 150, such as the Internet. In this case as well, the power managing procedure may be carried out by running an application stored in a memory of the remote controller unit and/or remotely available, for example through the Internet. The remote control unit 140 may be further configured to collect data sent from the appliances 110($i$) and store them into proper databases (not shown) in order to make them available by further remote control units.

The power managing procedure according to an embodiment of the present invention provides for scheduling the operation of the various house appliances 110($i$) of the domestic area 120 in such a way to efficiently manage the domestic electric power consumption, avoiding the occurrence of overloads and reducing the overall cost by concentrating as much as possible the operations of the house appliances 110($i$) in the hours of the day wherein the electric power cost is cheapest, respecting at the same time constraints imposed by the operation of the house appliances 110($i$) and the time preferences set by the user. For this purpose, the power managing procedure carried out by the local control unit 130 (and possibly by one or more remote control units 140) is directed to generate a time schedule—identified in figure with reference 160—of the house appliances 110($i$) operations optimized so as to accomplish the abovementioned objectives. As will be described in detail in the following of the present description, the time schedule 160 is generated by properly scheduling the start time of all energy phases of the power profiles of the appliances 110($i$), taking into account time and power constraints. The power managing procedure further provides for dynamically and rapidly updating the time schedule 160 in response to any possible unforeseeable or disruptive event, such as the direct request of activating a specific house appliance 110(i) by an user, the variation of the electric power cost due to a dynamic variation of the daily tariff profile, a possible imminent overload occurrence, the variation of electric power amount generated by photovoltaic solar panels as a result of cloud cover change and so on, so as to adapt the domestic electric power consumption in order to avoid the occurrences of overloads and reduce the costs.

Figure 1B:
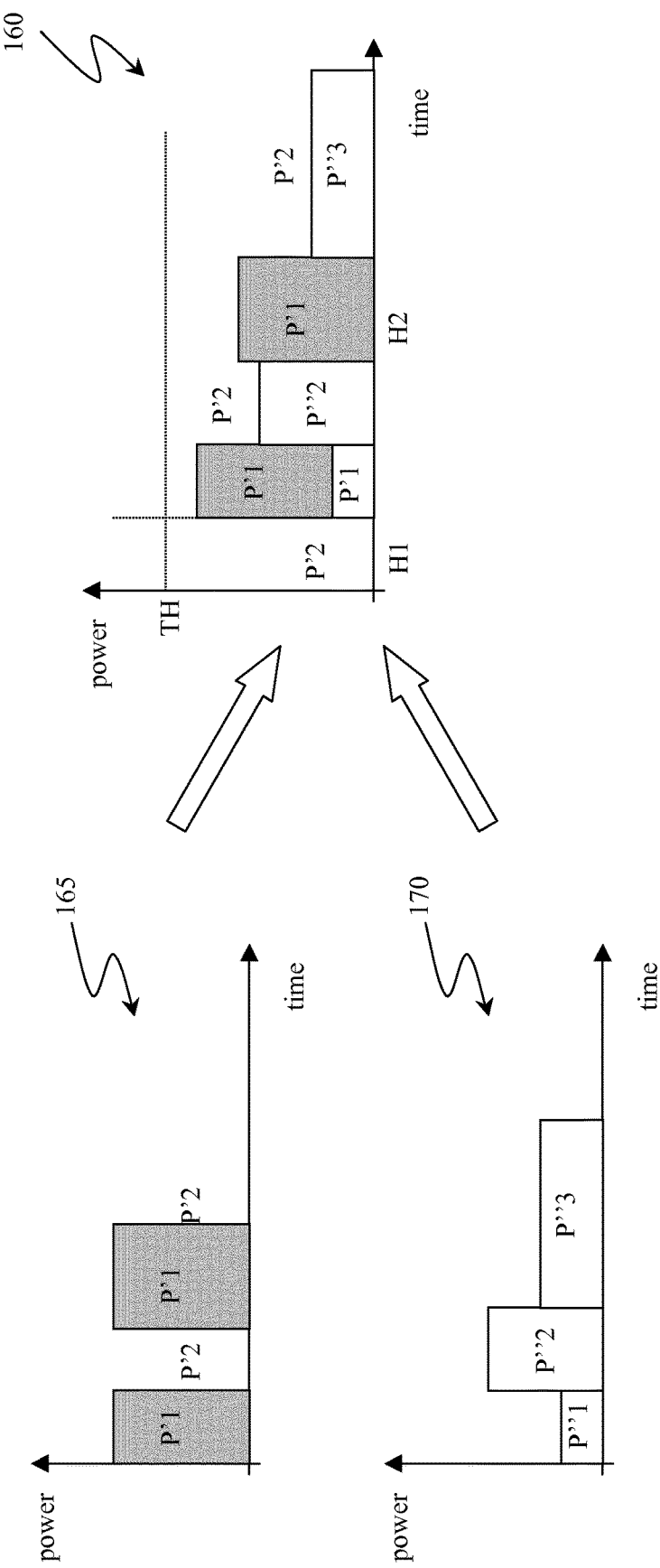
FIG. 1B illustrates an example of a time schedule of the house appliances generated by the system of FIG. 1A according to an embodiment of the present invention.

In order to illustrate how a possible time schedule 160 is structured according to an embodiment of the present invention, reference is made to the example of FIG. 1B. In this example, there is a first time slot H1 (e.g., the time slot corresponding to the office hours of a day) corresponding to a first electric power cost and a second time slot H2 (e.g., the time slot corresponding to the remaining hours of the day) corresponding to a second electric power cost lower than the first one. Moreover, in this very simplified example only two appliances 110(i) are considered, and namely:

an electric water heater, having a single power profile 165 comprising an alternating repetition of a first energy phase P'1, corresponding to the situation in which its heating resistance is on, and a second energy phase P'2, corresponding to the situation in which its heating resistance is off, and a washing machine, having a single power profile 170 comprising an ordered sequence of three energy phases: a first energy phase P"1 corresponding to a water loading phase, a second energy phase P"2 corresponding to a water heating phase, and a third energy phase P"3 corresponding to a drum rotation phase.

The exemplary time schedule 160 is generated by distributing in time the energy phases of the power profiles 160 and 170 in such a way that at any time the total power consumption is kept under the maximum power threshold TH of the power grid, so as to avoid any overload occurrence, and that the highest power consumptions preferably occur in the cheaper second time slot H2. The need of avoiding overload occurrences is one of possible power constraints affecting a scheduling, while the preference of concentrating the highest power consumptions in the cheapest hours of the day is one of possible time constraints affecting a scheduling. In the considered exemplary time schedule 160, during a first period it is scheduled the execution of the phase P'2, during a second period the concurrent execution of the energy phases P'1 and P"1, during a third period the concurrent execution of the energy phases P'2 and P"2, during a fourth period the execution of the energy phase P'1, and during a fifth period the concurrent execution of the energy phases P'2 and P"3. A further example of time constraint is given by the need of scheduling energy phase P"2 after energy phase P"1 and energy phase P"3 after energy phase P"2, in order to allow the washing machine to correctly operate. Moreover, while energy phase P"2 has been scheduled right away after energy phase P"1, in the exemplary schedule 160 illustrated in FIG. 1B a time interval occurs between the end of energy phase P"2 and the start of energy phase P"3. Since energy phase P"2 corresponds to a water heating phase, a still further time constraints might provide for the execution of the energy phase P"3 that is sufficiently close to the end of phase P"2, in order to avoid that water cools down to an extent such to compromise the washing machine operation efficiency.

In real actual cases, the appliances 110(i) located in the domestic area 120 are numerous, and the power profiles thereof includes a high number of energy phases, linked together by complicated time constrains. Consequently, generating optimized time schedules 160 is a very complex task, which is difficult to be accomplished. When the number of variables at stake is very high, it is nearly impossible to obtain the "overall best" time schedule in almost real time and without high computation capabilities (such as in the case of a system to be installed in a domestic area). Indeed, the generation of optimized time schedule can be classified as a "Resource Constrained Scheduling Problem", which is known as being an NP-hard combinatorial optimization problem. The system 100 according to the embodiments of the present invention is instead directed to calculate in relatively short times optimized time schedules 160 which have the quality of ones among the best time schedules, without the need of high computation capabilities. The quality of a time schedule 160 may be quantified by a corresponding cost function formed by a sum of penalty components each one measuring how a respective one of the abovementioned constraints has been violated by running the appliances 110(i) according to the time schedule 160. The better a constraint is respected, the lower its corresponding penalty component. Therefore, with the same conditions, a time schedule having a corresponding cost function value is considered to have a higher quality than other time schedules having higher cost function values.

Figure 2:
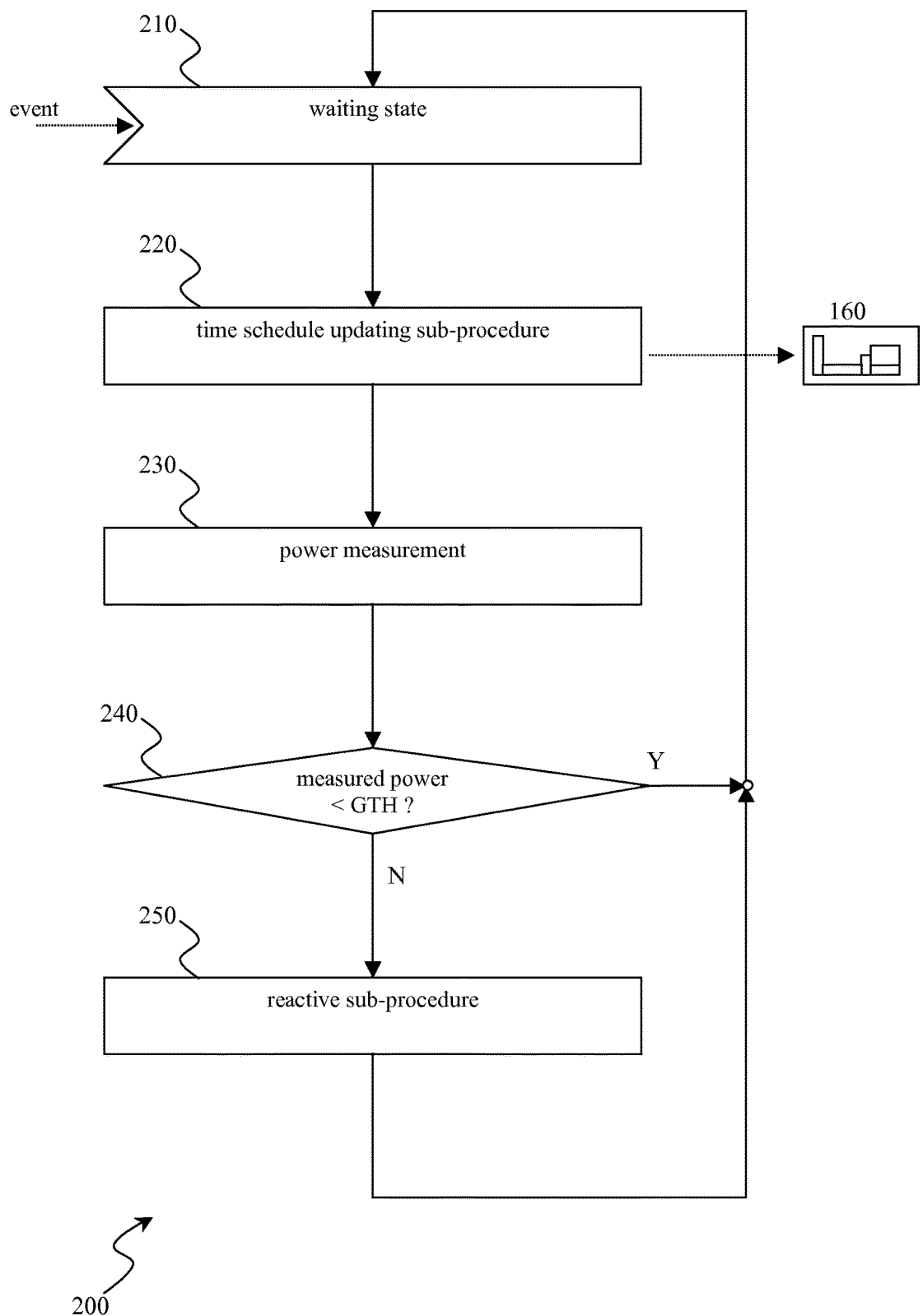
FIG. 2 illustrates in terms of functional blocks the main operations of a power managing procedure carried out by a local control unit of the system according to an embodiment of the present invention.

FIG. 2 illustrates in terms of functional blocks the main operations of the power managing procedure (identified in figure with reference 200) which is adapted to be carried out by the local central unit 130 for controlling the appliances 110(i) of the system 100 according to an embodiment of the present invention.

The local central unit 130 is configured to be constantly active, remaining in a waiting state ready to respond to any possible event requiring a new scheduling (block 210). Such event may be a direct request of activating a specific house appliance 110(i) by the user, the expiration of a predetermined time period, or a generic condition variation, such as an unplanned overload occurrence.

In response to such events, the local central unit 130 performs a time schedule updating sub-procedure (block 220), whose output is an updated version (i.e., which takes into account the event occurrence) of the time schedule 160. The appliances 110(i) of the system 100 are then informed of the changes carried out in the time schedule 160, so as to act accordingly. For this purpose, each appliance 110(i) is provided with data relating the portions of the updated time schedule 160 which concern the execution of energy phases of the power profile of such appliance 110(i). In case the appliance 110(i) is a smart appliance, it automatically adapts and synchronizes its operation based on the received data. If instead the appliance 110(i) is a standard "non-smart" appliance, connected to the power grid through a smart plug 135, the relay unit of the smart plug 135 is configured to control the appliance supply based on the received data.

After the time schedule updating procedure is carried out, the overall electric power actually drained by the presently active appliances 110(i) is measured (block 230), for example by a smart meter (not illustrated in the figures).

If the measured power is lower than a guard threshold GTH, which is advantageously set sufficiently lower than the maximum power threshold TH of the power grid, the local control unit 130 returns to its waiting state (exit branch Y of block 240, returning back to block 210).

If the measured power is instead higher than the guard threshold GTH, it means that the scheduling defined by the updated time schedule 160 is requiring a dangerously high electric power demand, which is too close to the maximum power threshold TH. In this case (exit branch N of block 240), the power managing procedure provides for carrying out a reactive sub-procedure (block 250) directed to reduce the power consumption and/or deactivate one or more of the currently active appliances 110(i) so as to brought the measured drained power under the guard threshold. After the execution of the reactive sub-procedure, the local control unit 130 returns to its waiting state.

Figure 3:
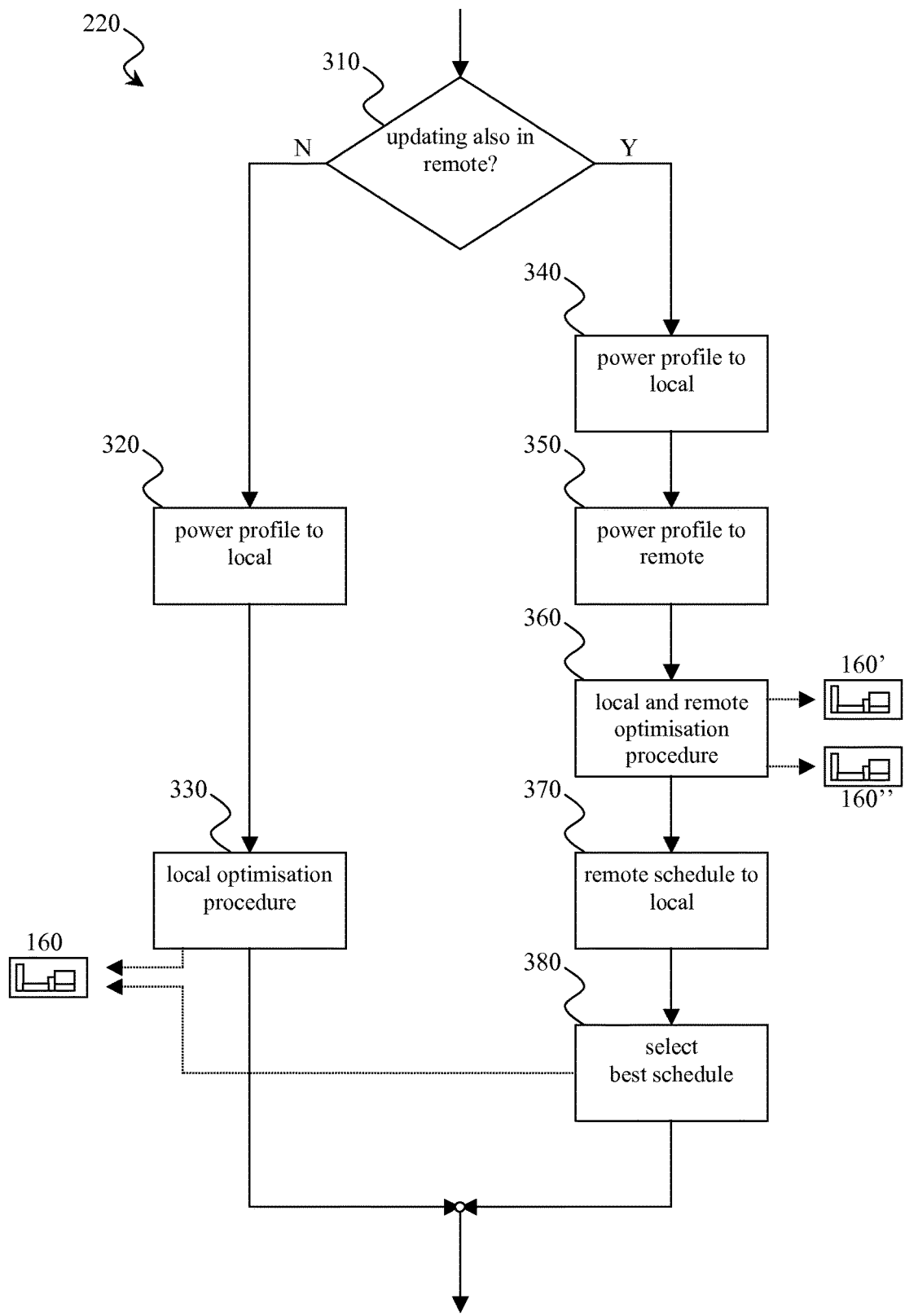
FIG. 3 illustrates in terms of functional blocks a time schedule updating sub-procedure of the power managing procedure of FIG. 2 according to an embodiment of the present invention.

FIG. 3 illustrates in terms of functional blocks the time schedule updating sub-procedure 220 according to an embodiment of the present invention.

As already mentioned above, one or more remote control units 140 may be interfaced with the local control unit 130, for example through the Internet. According to an embodiment of the present invention, the time schedule updating sub-procedure 220 may be carried out by the local control unit 130 only (exit branch N of block 310), as well as both by the local control unit 130 and by the remote control unit(s) 140 (exit branch Y of block 310).

Making reference in particular to the first case (operations performed on local control unit 130 side only), when the user sends a request of activating a specific appliance 110(i), according to an embodiment of the present invention the power profile of such appliance 110(i) is transmitted to the local control unit 130 (block 320). According to another embodiment of the invention, instead of transmitting the power profile of an appliance 110(i) every time the appliance 110(i) is requested to be activated by a user, the power profiles of all the appliances 110(i) are already stored in a local or remote database (not illustrated), which can be accessed by the local control unit 130. In any case, if the event which has triggered the time schedule updating sub-procedure 220 is a time period expiration or a condition variation, the local control unit 130 does not require any new power profile, and the operations of block 320 are skipped. At this point, as will be described in greater detail in the following of the description, the local control unit 130 executes an optimization procedure to update the selected time schedule 160 (block 330) taking into account also the newly received data (if present). It has to be noted that the first time the optimization algorithm is carried out, e.g., the first time a user requests the activation of an appliance 110(i), or in case the event having triggered the time schedule updating sub-procedure 220 has occurred after that all possible previously scheduled appliance operations have already terminated, the time schedule 160 to be updated will be a blank time schedule.

Making reference to the second case (operations concurrently performed on local control unit 130 and remote control unit 140), the power profile of the appliance 110(i) that is requested to be activated is transmitted to the local control unit 130 (block 340). As in the previous case, according to an embodiment of the present invention, the local control unit 130 may retrieve the power profile by accessing a proper database. Again, if the event which has triggered the time schedule updating sub-procedure 220 is a time period expiration or a condition variation, the local control unit 130 does not require any new power profile, and the operations of block 340 are skipped. The same power profile of the appliance 110(i) that is requested to be activated is then transmitted to the remote control unit 140 (block 350). At this point, both the local control unit 130 and the remote control unit 140 independently execute an optimization procedure to update the selected time schedule 160 (block 360). Such optimization procedure is equal to the one performed at block 330. Since the local control unit 130 and the remote control unit 140 run the optimization algorithm independently of each other, the updated time schedule 160' generated by the former will generally differ from the updated time schedule 160" generated by the latter. The updated time schedule 160" generated by the remote control unit 140 is then transmitted to the local control unit 130 (block 370). The cost functions of the two time schedules 160', 160" are then compared to each other, and the selected time schedule 160 will be the one having the lowest cost function (block 380).

According to an embodiment of the present invention, the optimization procedure 330 (and, therefore, the optimization procedure 360) is based on a Particle Swarm Optimization (PSO) approach. The PSO approach is a population-based metaheuristic algorithm, which has been inspired by swarm intelligence of fish and birds. Briefly, the optimization procedure 330 provides for randomly generating a population, hence referred to as "swarm", of candidate solutions (i.e., candidate time schedules), referred to as "particles of the swarm", and then moving these particles in the search-space comprising all the possible time schedules. Each particle's movement is influenced by its personal best position in the search-space (i.e., the position corresponding to the lowest cost function value among the positions thus far found by that particle) as well as by the global best position in the search-space (i.e., the position corresponding to the lowest cost function value among all positions thus far found by all the particles in the swarm). This combined knowledge will move the swarm of particles toward the best solutions.

According to the PSO approach, each individual particle is identified by a position vector and by a corresponding velocity vector. The PSO approach is iterative, wherein the position vector and the velocity vector of each particle are updated at each iteration. A possible example of PSO approach provides for updating the position vector and the velocity vector in the following way:

the velocity vector is updated by weighting the velocity vector of the previous iteration by an inertia parameter, and by summing the weighted velocity vector of the previous iteration with:
  a) a first velocity array component, which is directed towards the particle personal best position and has a magnitude proportional to a first random number, for example uniformly distributed in [0,1], and
  b) a second velocity array component, which is directed toward the global best position and has a magnitude proportional to a second random number, for example uniformly distributed in [0,1], the position vector is updated by summing the position vector of the previous iteration with the updated velocity vector.

Therefore, each particle in the swarm modifies its position with a velocity that includes a first velocity component that attracts the particle towards the best position so far achieved by the particle itself, and a second velocity component that attracts the particle toward the best solution so far achieved by the swarm as a whole. The first velocity component represents the "personal experience" of the particle, while the second velocity component represents the "social communication skill" of the particles.

An example of a PSO approach implementation is disclosed in *Particle Swarm Optimization* by Kennedy, J. and Eberhart, R. in Proc. Of the IEEE Int. Conf. On Neural Networks, Piscataway, NK, pages 1942-1948.

According to an embodiment of the present invention, the optimization procedure 330 is based on a Quantum Particle Swarm Optimization (QPSO) approach, i.e., a PSO approach in which the particles of the swarm are moved in the search-space according to quantum mechanics laws. In classical (non-quantum) PSO, particles have a mass and move in the search space by following Newtonian dynamics, updating their position and velocity vectors at each iteration. Conversely, in quantum mechanic the position and the velocity of a particle cannot be determined simultaneously according to the uncertainty principle. In QPSO, the positions of the particles are determined by a wavefunction, where an attractive potential field will eventually pull all particles to the location defined by corresponding local attractors. For example, according to an embodiment of the present invention, the wavefunction may be the Schrödinger equation.

Examples of QPSO are disclosed in Particle swarm optimization with particles having quantum behavior by J. Sun, B. Feng, and W. Xu, IEEE Congress on Evolutionary Computation, pp. 325-31, 2004, Adaptive Parameter Selection of Quantum-Behaved Particle Swarm Optimization on Global Level, by Wenbo Xu, Jun Sun and Bin Feng, School of Information Technology, Southern Yangtze University, Wuxi, Jiangsu, China, MESFET DC model parameter extraction using Quantum Particle Swarm Optimization, by Samrat L. Sabat, Leandro dos Santos Coelho, Ajith Abraham, Microelectronics Reliability 49 (2009), A Review of Quantum-behaved Particle Swarm Optimization, Wei Fang, Jun Sun, Yanrui Ding, Xiaojun Wu, Wenbo Xu, School of Information Technology, Jiangnan University, No 1800, Lihu Avenue, Wuxi 214 122, China.

According to an embodiment of the present invention, the motion of the particles (either performed following a PSO or a QPSO approach) is further based on a "nature-inspired evolutionary flight," i.e., it follows a random walk based on a nature-inspired fractal evolution typical of many natural phenomena and higher order animal behavior.

A random walk is a series of consecutive random steps starting from an origin position. In a random walk, the next position only depends on the current position and on the next step. The next step is calculated based on a random number drawn from a certain probability distribution. In case such probability distribution is the Gaussian distribution, the random walk becomes the Brownian motion.

Various studies have shown that the behavior of many animals and insects follows a random walk based on a Lévy probability distribution. Lévy probability distribution is a probability distribution both stable and heavy-tailed. A stable distribution is such that any sum of n random numbers drawn from the distribution is finite and can be expressed as $$\sum_{i=1}^{n} x_i = n^{1/\alpha} x,$$

where $\alpha$, called "index of stability", controls the shape of the distribution probability ($0<\alpha\leq 2$). A heavy-tailed distribution has an infinite variance decaying at large x to $\lambda(x) \sim |x|^{-1-\alpha}$. Due to the stable property, a random walk following the Lévy distribution will cover a finite distance from its original position after any number of steps. But also due to the heavy tail (divergence of the variance), extremely long jumps may occur and typical trajectories are self-similar, on all scales showing clusters of shorter steps interspersed by long excursions.

Lévy distributions are for example disclosed in *Introduction to the theory of Lévy flights*, by A. V. Chechkin, R. Metzler, J. Klafter, and V. Yu. Gonchar.

According to an embodiment of the present invention, the optimization procedure 330 is based on a QPSO approach which exploits a Lévy probability distribution. A Quantum Particle Swarm Optimization algorithm with the Lévy probability distribution provides for a particle's motion circumscribed in the neighborhoods of solutions, but at the same time allowing for extremely long jumps to escape from local optima.

Figure 4:
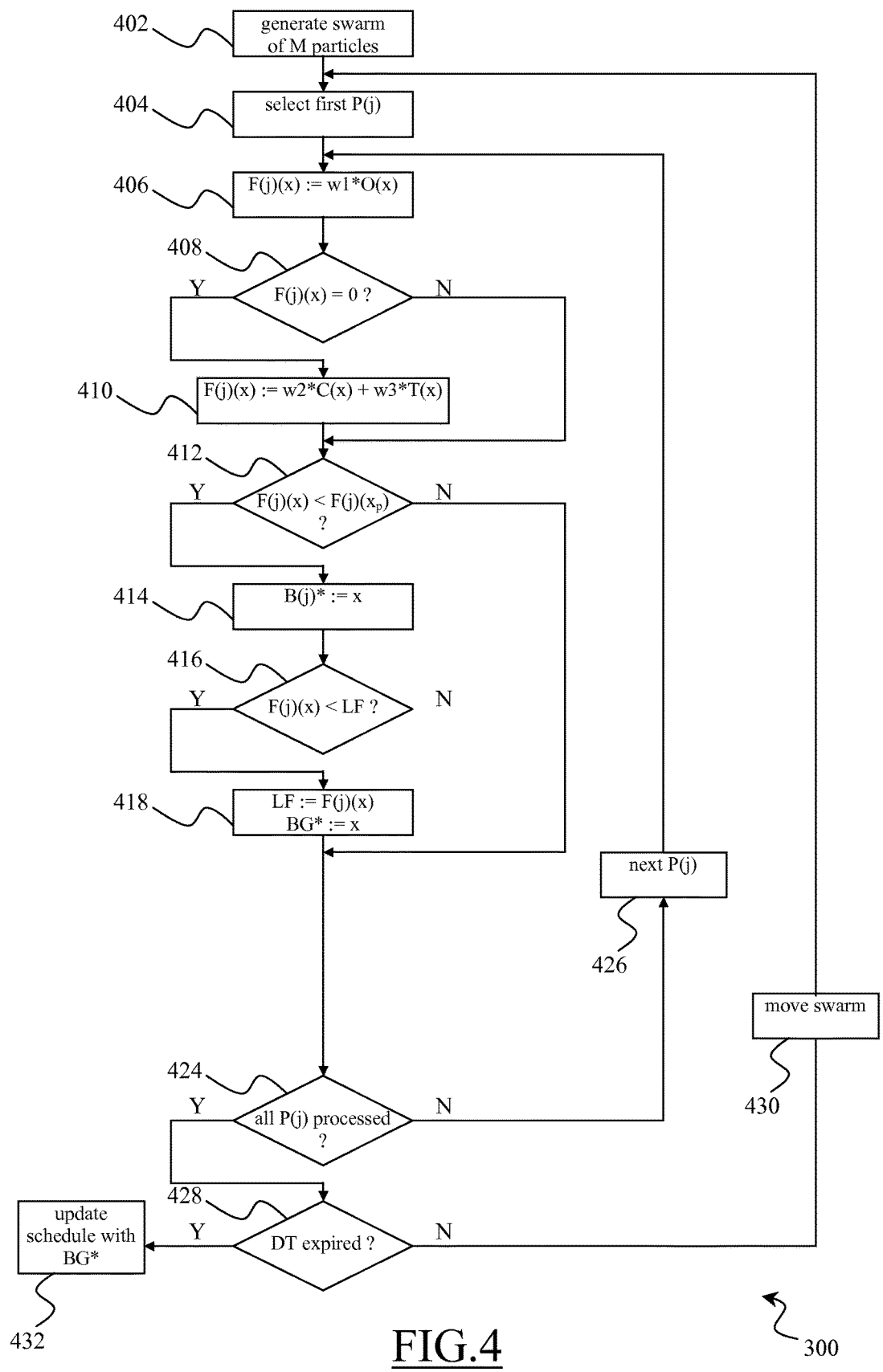
FIG. 4 illustrates in terms of functional blocks an optimization procedure of the time schedule updating sub-procedure of FIG. 3 according to an embodiment of the present invention.

FIG. 4 illustrates in terms of functional blocks the optimization procedure 330 (or the optimization procedure 360) according to an embodiment of the present invention. Although the optimization procedure will be now described making reference to the local control unit 130 only, it has to be appreciated that the phases thereof may be carried out by the remote control unit 140 as well.

In a first phase of the optimization procedure (block 402), the local control unit 130 creates the swarm by generating M particles P(j) (j=1 to M) and positioning them randomly in a search-space X of all the possible solutions (time schedules) x. In the foregoing the "search space" should be construed as the temporal domain in a time period ahead of present time. The number M of particles of the swarm affects both the outcome and the computational cost of the procedure. A large number of particles provide for a broader search, but at the same time updating too many particles may reduce the convergence of the algorithm that needs to focus the search in the whereabouts of the most promising spots so as to find good solutions in relatively short time.

Then, the local control unit 130 selects a particle P(j) of the swarm (block 404) and carries out the following cycle (blocks from 406 to 418) thereon.

In blocks 406 to 410, the local control unit 130 calculates the cost function F(j)(x) of the solution x corresponding to the current position of the particle P(j).

For this purpose, the local control unit 130 calculates an overload penalty O(x) that measures how much the overload constraint is violated by using solution x, and then sets the cost function F(j)(x) to w1*O(x), wherein w1 is a weight coefficient, for example on the order of $10^9$ (block 406). According to an embodiment of the invention, the overload penalty may be equal to 0 for the solutions x in which the overload is totally avoided (i.e., when the total power consumption is kept under the maximum power threshold TH of the power grid), while it is higher than 0 for the solutions x corresponding to an overload occurrences (e.g., with the value of O(x) that increases as the total power consumption departs from the maximum power threshold TH).

If the overload penalty O(x) is equal to zero, and thus F(j)(x)=0, (exit branch Y of block 408), meaning that the overload constraint is fulfilled, the local control unit 130 calculates an energy cost penalty C(x) that measures how much the electric energy would cost using the solution x based on the daily tariff profile known in advance, and a tardiness penalty T(x) that provides a measure of how much the time requirements provided by the user are fulfilled. The earlier the time schedule corresponding to a solution x provides for the completion of the appliance operations within time requirements provided by the user, the lower the tardiness of such solution. Intuitively, the algorithm gives a better score to solutions that complete earlier rather than later. Therefore, the cost function F(j)(x) is set to w2*C(x)+w3*T(x), wherein w2 and w3 are weight coefficients (block 410). For example, w2 may be on the order of 1 and w3 may be on the order of $10^{-3}$.

If instead the overload penalty O(x) is higher than zero, and thus F(j)(x)>0, (exit branch N of block 408), the power cost penalty C(x) and the tardiness penalty T(x) contributions to the cost function F(j)(x) are neglected due to the large magnitude of the respective weights as described in the foregoing. According to an alternative embodiment of the present invention, the contributions of the power cost penalty C(x) and of the tardiness penalty T(x) are instead considered also in case the overload penalty O(x) is higher than zero.

In any case, the weight coefficient w1 of the overload penalty O(x) is advantageously set much higher than the weight coefficients w2 and w3 of the power cost penalty C(x) and of the tardiness penalty T(x), so as to provide the overload constraint with the highest priority.

Afterward, the local control unit 130 checks whether the just calculated cost function F(j)(x) value of the solution x corresponding to the current position of the particle P(j) is lower than the cost function F(i)($x_p$) value of the solution $x_p$ corresponding to the position of the same particle P(j) in a previous swarm arrangement (block 412).

In the affirmative case (exit branch Y of block 412), the solution x corresponding to the current position of the particle P(j) is elected as the personal best solution B(j)* so far taken by the particle P(j) (block 414). In the negative case (exit branch N of block 412, going to block 424), the personal best solution B(j)* so far taken by the particle P(j) is kept unchanged.

If the current position of the particle P(j) is elected as the personal best solution B(j)* so far taken by the particle P(j), the local control unit 130 checks whether the just calculated cost function F(j)(x) value of the solution x corresponding to the current position of the particle P(j) is also lower than the lowest cost function value (hereinafter referred to as lowest global cost function value LF) so far taken by any particle P(j) of the swarm (block 416).

In the affirmative case (exit branch Y of block 416), the lowest global cost function value LF is set to the just calculated cost function F(j)(x) value, and the solution x corresponding to the current position of the particle P(j) is elected as the global best solution in the swarm BG* (block 418). In the negative case (exit branch N of block 416), block 418 is skipped, and the global best solution so far reached in the swarm BG* is kept unchanged.

The local control unit 130 checks if all the M particles P(j) of the swarm have been subjected to the operations corresponding to blocks from 406 to 418 described above.

In the negative case (exit branch N of block 424), the local control unit 130 selects a new particle P(j) of the swarm (block 426) and repeats the operations corresponding to blocks from 406 to 418 on the new particle P(j) (return to block 406).

In the affirmative case (exit branch Y of block 424), the local control unit 130 checks whether a deadline time DT is expired or not (block 428) from the beginning of the optimization procedure 330.

If the deadline time DT has not yet expired (exit branch N of block 428), the swarm arrangement is changed by moving the M particles P(j) thereof in the search-space according to a swarm flight procedure (block 430), as will be described later on. Then, the local control unit 130 repeats the operations corresponding to blocks from 404 to 426 on all the M particles P(j) of the swarm in the new arrangement (return to block 406).

If the deadline time DT has expired (exit branch N of block 428), the optimization procedure 330 is terminated, and the current time schedule 160 is updated with the time schedule corresponding to the solution x in the search-space which is the global best solution in the swarm BG* (block 432).

The deadline time DT is set in such a way to allow the operations corresponding to blocks from 404 to 426 that are carried out on all the M particles P(j) of the swarm to be repeated for a substantial high number of new swarm arrangements. Generally, the higher the deadline time DT, the lower the cost function corresponding to the global best solution in the swarm BG*. However, a long deadline time DT may reduce the time schedule 160 updating responsiveness of the system 100 to possible occurring events.

Figure 5:
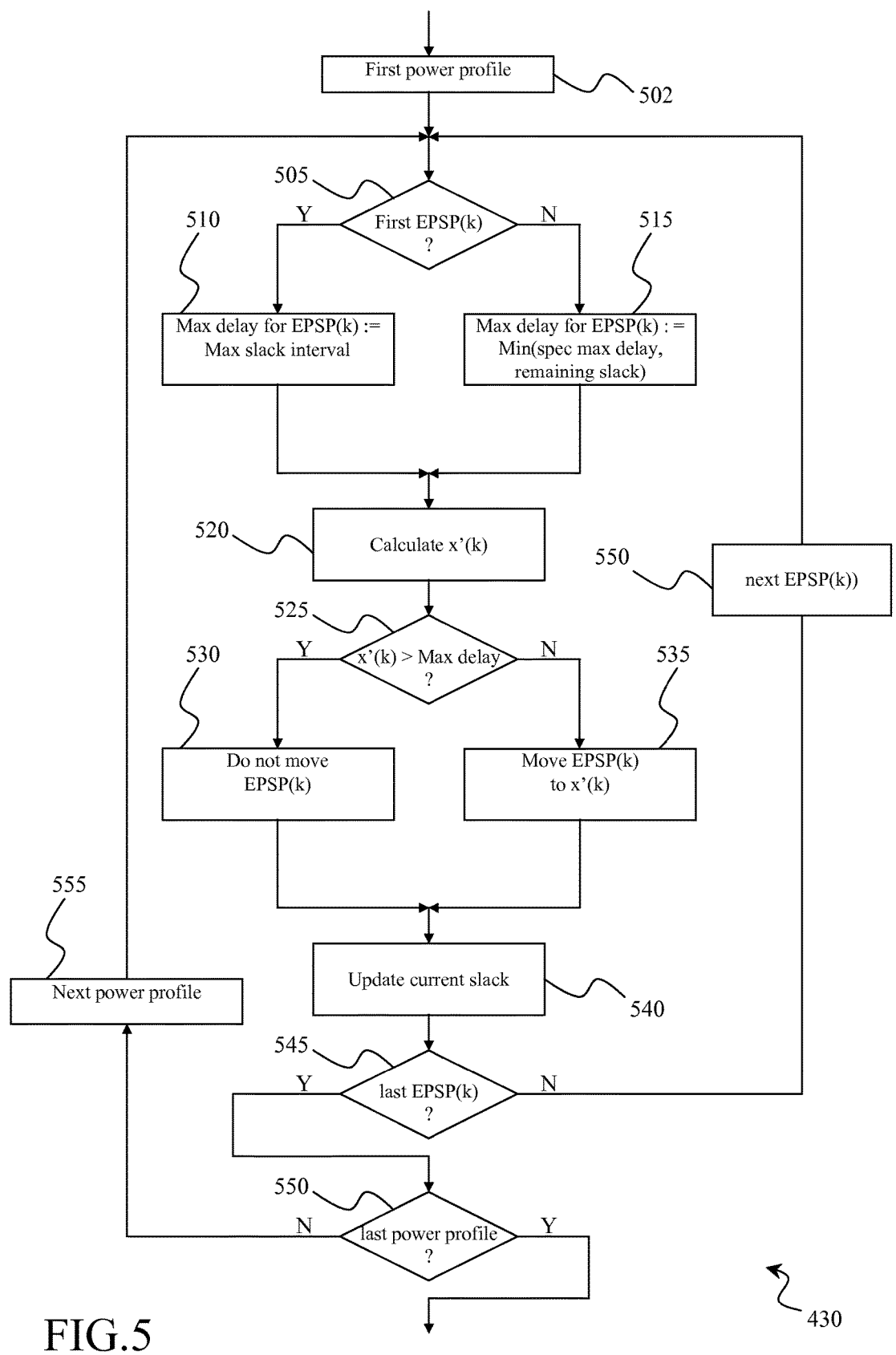
FIG. 5 illustrates in terms of functional blocks a swarm flight procedure according to an embodiment of the present invention.

FIG. 5 illustrates in terms of functional blocks the swarm flight procedure 430 according to an embodiment of the present invention.

As previously mentioned, each particle P(j) of the swarm corresponds to a complete solution, i.e., to a specific distribution in time of the energy phases of the power profiles of the appliances 110(i). Since the swarm flight procedure 430 applies to the energy phase level, each particle P(j) of the swarm is made to correspond to a plurality of power profile sub-particles, each one corresponding in turn to a respective plurality of energy phase sub-particles, wherein each power profile sub-particle corresponds to a specific power profile and each energy phase sub-particle corresponds to a specific energy phase of such power profile.

The swarm flight procedure 430 provides that the local control unit 130 carries out a same sequence of operations for each power profile of the solution corresponding to a generic particle P(j), starting from a first power profile (block 502), and terminating when reaching the last power profile of the particle P(j).

Moreover, the local control unit 130 carries out a same sequence of operations for each energy phase sub-particle EPSP(k) (k=1, 2, . . . ) of the generic power profile, starting from the first energy phase sub-particle EPSP(k) corresponding to the first energy phase of the power profile, and terminating when reaching the last energy phase sub-particle EPSP(k) corresponding to the last energy phase of the power profile.

If the energy phase sub-particle EPSP(k) corresponds to the first energy phase of the power profile (exit branch Y of block 505), the local control unit 130 sets the maximum delay for this energy phase to the maximum slack interval of the whole power profile (block 510), which is set by the user. If instead the energy phase sub-particle EPSP(k) corresponds to an energy phase of the power profile different from the first (exit branch N of block 505), the local control unit 130 sets the maximum delay for this energy phase to the minimum between its maximum delay imposed by the power profile specification and the remaining current slack interval of the power profile (block 515).

After having calculated the maximum delay for the energy phase (either block 510 or block 515), the local control unit 130 calculates a candidate new position x'(k) for the energy phase sub-particle EPSP(k) (block 520). More in detail, according to an embodiment of the present invention the local control unit 130 calculates a corresponding personal attractor position a(k) as shown in the following equation:

$$a(k)=r \cdot p(k)+(1-r) \cdot g^*(k),$$

wherein r is a random number with uniform distribution in [0,1], p(k) is the local best position so far taken by the energy phase sub-particle EPSP(k), which is determined in turn by the local best solution B(j)* so far taken by the particle P(j), and g*(k) is the global best position of the swarm so far taken by the energy phase sub-particle, which is determined in turn by the global best solution in the swarm BG*. Then, the candidate new position x'(k) for the energy phase sub-particle EPSP(k) is set to:

$$x'(k)=a(k)+b \cdot (a(k)-x(k)) \cdot c,$$

wherein b is a constant, the constriction coefficient, which controls the step size of the jump from the previous position x(k) of the energy phase sub-particle EPSP(k), and c is a random number with Lévy distribution.

At this point, the local control unit 130 checks if the candidate new position x'(k) corresponds to a delay for the energy phase sub-particle EPSP(k) that is higher than the maximum delay for the corresponding energy phase (block 525).

In the affirmative case (exit branch Y of block 525), the candidate new position x'(k) is discarded (block 530), and the energy phase sub-particle EPSP(k) is not moved, while in the negative case (exit branch N of block 525) is actually moved to the candidate new position x'(k) (block 535).

Then, the slack interval for the energy phase sub-particle EPSP(k) is updated taking into account the new position (block 540).

Afterward, a check is made (block 545) to determine whether the energy phase sub-particle EPSP(k) is the last one of the power profile or not. If the energy phase sub-particle EPSP(k) is not the last one (exit branch N of block 545), the previously described operation sequence is reiterated on the next energy phase sub-particle EPSP(k+1) of the power profile (block 550, then return back to block 505). If instead the energy phase sub-particle EPSP(k) is the last one (exit branch N of block 545), it means that all the energy phases of the power profile have been scheduled.

In this case, the local control unit 130 checks whether the power profile is the last one of the particle P(j) or not.

If the power profile is not the last one (exit branch N of block 550), the local control unit 130 selects a next power profile of the particle P(j) (block 555) and reiterates the operation previously described for the energy phase sub-particles EPSP(k) of the new power profile (return to block 505).

If instead the power profile is the last power profile of the particle P(j) (exit branch Y of block 550), the procedure for that particle P(j) is completed.

The swarm flight procedure 430 is terminated when all the energy phase sub-particles EPSP(k) of all the power profiles of all the particles P(j) of the swarm have been processed, altering the swarm arrangement.

Figure 6:
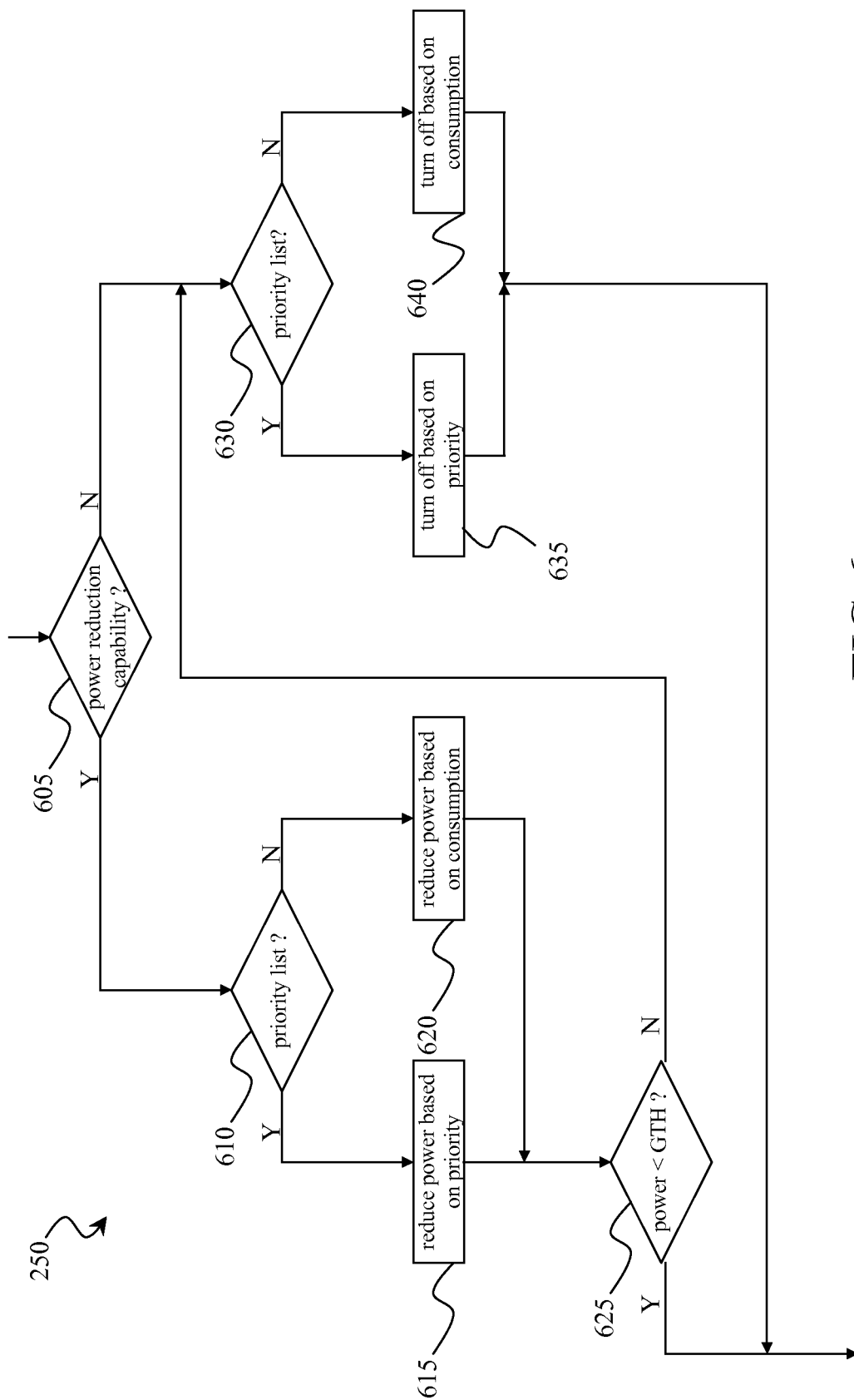
FIG. 6 illustrates in terms of functional blocks a reactive sub-procedure of the power managing procedure of FIG. 2 according to an embodiment of the present invention.

FIG. 6 illustrates in terms of functional blocks the reactive sub-procedure 250 of the power managing procedure 200 illustrated in FIG. 2 according to an embodiment of the present invention. Purpose of the reactive sub-procedure 250 is to reduce the power consumption and/or deactivate the currently active appliances 110(i) in case the overall electric power actually drained by the presently active appliances 110(i) is higher than the guard threshold GTH.

Firstly, the local control unit 130 checks if among the currently active appliances 110(i) there is at least one appliance 110(i) that can be regulated so as to reduce its power consumption (block 605).

In the affirmative case (exit branch Y of block 605), the local control unit 130 checks whether the user of the system 100 has set a priority list of the appliances 110(i) or not (block 610).

In the affirmative case (exit branch Y of block 610), the local control unit 130 starts a priority-based dimming procedure (block 615) which provides for sequentially driving the appliances 110(i) in such a way to reduce their power consumptions based on the priority list. In detail, the control unit 130 drives the first appliance 110(i) listed in the priority list for reducing its current power consumption. Then, if the overall electric power actually drained falls below the guard threshold GTH, the priority-based dimming procedure 615 is terminated, otherwise the control unit 130 drives the power reduction of the second appliance 110(i) of the priority list. The priority-based dimming procedure 615 is reiterated until the overall electric power actually drained falls below than the guard threshold GTH, or until all the appliances 110(i) listed in the priority list have been driven to reduce their power consumption.

In case the priority list is not present (exit branch N of block 605), the local control unit 130 starts a consumption-based dimming procedure (block 620) which provides for sequentially driving the appliances 110(i) starting from the ones which consume more. In detail, the control unit 130 drives the appliance 110(i) which currently has the highest power consumption so as to reduce it. Then, if the overall electric power actually drained falls below the guard threshold GTH, the consumption-based dimming procedure 620 is terminated, otherwise the control unit 130 drives the power reduction of the appliance 110(i) currently having the second highest power consumption. The consumption-based dimming procedure 620 is reiterated until the overall electric power actually drained falls below than the guard threshold GTH, or until all the appliances 110(i) have been driven to reduce their power consumption.

In any case, at the end of the priority-based dimming procedure (block 615) or at the end of the consumption-based dimming procedure (block 620), a further check is made for assessing whether the overall electric power actually drained falls below the guard threshold GTH (block 625) or not.

In the affirmative case (exit branch Y of block 625), the reactive sub-procedure 250 is terminated (returning back to block 210 of the power managing procedure 200 of FIG. 2).

In the negative case (exit branch N of block 625), or in case the local control unit 130 has assessed that among the currently active appliances 110(i) there are not appliances 110(i) that can be regulated so as to reduce their power consumption (exit branch N of block 605), the local control unit 130 reduces the overall electric power consumption by turning off one or more appliance 110(i).

More in detail, the local control unit 130 checks whether the user of the system 100 has set a priority list of the appliances 110(i) or not (block 630).

In the affirmative case (exit branch Y of block 630), the local control unit 130 starts a priority-based turning off procedure (block 635) which provides for sequentially turning off the appliances 110(i) based on the priority list. In detail, the control unit 130 turns off the first appliance 110(i) listed in the priority list. Then, if the overall electric power actually drained falls below the guard threshold GTH, the priority-based turning off procedure 635 is terminated, otherwise the control unit 130 turns off the second appliance 110(i) of the priority list. The priority-based turning off procedure 635 is reiterated until the overall electric power actually drained falls below than the guard threshold GTH.

In case the priority list is not present (exit branch N of block 630), the local control unit 130 starts a consumption-based turning off procedure (block 640) which provides for sequentially turning off the appliances 110(i) starting from the ones which consume more. In detail, the control unit 130 turns off the appliance 110(i) which currently has the highest power consumption. Then, if the overall electric power actually drained falls below the guard threshold GTH, the consumption-based turning off procedure 640 is terminated, otherwise the control unit 130 turns off the appliance 110(i) currently having the second highest power consumption. The consumption-based turning off procedure 640 is reiterated until the overall electric power actually drained falls below the guard threshold GTH.

In any case, at the end of the priority-based turning off procedure (block 635) or at the end of the consumption-based turning off procedure (block 640), the reactive sub-procedure 250 is terminated (returning back to block 210 of the power managing procedure 200 of FIG. 2).

In order to improve the power management efficiency, according to an embodiment of the present invention the local control unit 130 is provided with a forecaster module (not illustrated) adapted to collect data regarding how the electric power consumption of the appliances 110($i$) in the domestic area 120 has evolved up to the present and carry out a statistical analysis on such collected data to predict future power consumptions, so as to influence the power managing procedure 200 in such a way to minimize the occurrences of guard threshold GTH exceeding.

The previous description presents and discusses in detail several embodiments of the present invention; nevertheless, several changes to the described embodiments, as well as different invention embodiments are possible, without departing from the scope defined by the appended claims.

The invention claimed is:

1. A system for managing house appliances supplied through a power grid, each house appliance being adapted to operate according to at least one corresponding operative mode, each operative mode comprising a sequence of operative phases, the system comprising at least one control unit interfaced with the house appliances for exchanging data, the at least one control unit being configured to:

collect power profile data comprising timing and electric power consumption data of each operative phase of each operative mode of the house appliances;

generate a time schedule of the house appliances operations by distributing in time execution of the operative phases thereof in such a way that a total power consumption of the house appliances is kept under a maximum power threshold of the power grid, wherein the distributing in time the execution of the operative phases comprises maintaining a first sequence of operative phases for a first appliance of the house appliances and shifting in time one or more operative phases of a second sequence of operative phases for a second appliance of the house appliances, wherein the at least one control unit is configured to generate the time schedule by:

randomly generating a population of candidate time schedules within a search space comprising a plurality of candidate time schedules;

for each candidate time schedule of the population, calculating a corresponding cost by using a cost function;

moving the candidate time schedules in the search space based on the cost thereof with a Quantum Particle Swarm Optimization approach exploiting a Lévy probability distribution; and generating the time schedule based on the candidate time schedules; and control the operation of the appliances based on the time schedule, wherein the at least one control unit is configured to generate the time schedule by exploiting a Particle Swarm Optimization approach based on a nature-inspired evolutionary flight.

2. The system of claim 1, wherein the at least one control unit is configured to:

select a candidate time schedule global best position in the search space among positions previously taken by the plurality of candidate time schedules in the search space based on the cost thereof, and for each candidate time schedule, moving the candidate time schedule by:

selecting a candidate time schedule personal best position in the search space among positions previously taken by such candidate time schedule in the search space based on the cost thereof, and moving the candidate time schedule based on the candidate time schedule global best position and based on its candidate time schedule personal best position.

3. The system of claim 2, wherein the at least one control unit is configured to move the candidate time schedule from a current position in the search space to a new position in the search space by:

calculating a personal attractor position in the search space based on the candidate time schedule personal best position and based on the candidate time schedule global best position, and setting the new position in the search space based on the personal attractor position and based on a difference between:

a) the personal attractor position, and b) the current position, multiplied by a random number with Lévy distribution.

4. The system of claim 1, wherein the cost function of a candidate time schedule depends on a difference between the maximum power threshold of the power grid and a power consumption of the house appliances that would occur if the house appliances operated following the candidate time schedule.

5. The system of claim 4, wherein the cost function of a candidate time schedule further depends on one or more of user preferences or constraints imposed by the operative modes of the house appliances.

6. The system of claim 1, wherein the at least one control unit is further configured to control the house appliances in order to perform one or more of reducing power consumption of currently active house appliances or deactivating at least one of the currently active house appliances if the power consumption of the currently active house appliances is higher than a guard threshold lower than the maximum power threshold of the power grid.

7. The system of claim 6, wherein the at least one control unit is configured to perform one or more of sequentially driving the currently active house appliances to reduce the power consumption thereof or sequentially deactivating the currently active house appliances according to a priority list defined by a user or starting from the currently active house appliances consuming more power, until the power consumption of the currently active house appliances falls below the guard threshold.

8. The system of claim 1, wherein the house appliances are located in a domestic area, and the at least one control unit comprises a local control unit located in the domestic area wirelessly interfaced with the house appliance for exchanging data.

9. The system of claim 8, wherein the at least one control unit further comprises at least one remote control unit remotely connected with the local control unit, and wherein:

the at least one remote control unit is configured to generate at least one remotely generated time schedule, and the local control unit is configured to generate a locally generated time schedule, the time schedule being selected between the at least one remotely generated time schedule and the locally generated time schedule based on costs of the at least one remotely generated time schedule and of the locally generated time schedule.

10. A method for managing house appliances supplied through a power grid, each house appliance being adapted to operate according to at least one corresponding operative mode, each operative mode comprising a sequence of operative phases, the method comprising:
collecting power profile data comprising timing and electric power consumption data of each operative phase of each operative mode of the house appliances;
generating a time schedule of house appliances operations by distributing in time execution of the operative phases thereof in such a way that a total power consumption of the house appliances is kept under a maximum power threshold of the power grid, wherein the distributing in time the execution of the operative phases comprises maintaining a first sequence of operative phases for a first appliance of the house appliances and shifting in time one or more operative phases of a second sequence of operative phases for a second appliance of the house appliances, wherein the generating the time schedule comprises:
randomly generating a population of candidate time schedules within a search space comprising a plurality of candidate time schedules;
for each candidate time schedule of the population, calculating a corresponding cost by using a cost function;
moving the candidate time schedules in the search space based on the cost thereof with a Quantum Particle Swarm Optimization approach exploiting a Lévyprobability distribution; and
generating the time schedule based on the candidate time schedules; and
controlling the operation of the house appliances based on the time schedule,
wherein the step of generating the time schedule includes exploiting a Particle Swarm Optimization approach based on a nature-inspired evolutionary flight.

11. The method of claim 10, further comprising:
selecting a candidate time schedule global best position in the search space among positions previously taken by the plurality of candidate time schedules in the search space based on the cost thereof, and
for each candidate time schedule, moving the candidate time schedule by:
selecting a candidate time schedule personal best position in the search space among positions previously taken by such candidate time schedule in the search space based on the cost thereof, and
moving the candidate time schedule based on the candidate time schedule global best position and based on its candidate time schedule personal best position.

12. The method of claim 11, wherein the moving the candidate time schedule from a current position in the search space to a new position in the search space comprises:
calculating a personal attractor position in the search space based on the candidate time schedule personal best position and based on the candidate time schedule global best position, and
setting the new position in the search space based on the personal attractor position and based on a difference between:
a) the personal attractor position, and
b) the current position,
multiplied by a random number with Lévy distribution.

13. A computer readable medium having a software program stored thereon that, when executed by a processor, causes the processor to perform operations comprising:
collecting power profile data comprising timing and electric power consumption data of each operative phase of each operative mode of house appliances;
generating a time schedule of operations of the house appliances by distributing in time execution of the operative phases thereof in such a way that a total power consumption of the house appliances is kept under a maximum power threshold of the power grid, wherein the distributing in time the execution of the operative phases comprises maintaining a first sequence of operative phases for a first appliance of the house appliances and shifting in time one or more operative phases of a second sequence of operative phases for a second appliance of the house appliances, wherein the generating the time schedule comprises:
randomly generating a population of candidate time schedules within a search space comprising a plurality of candidate time schedules;
for each candidate time schedule of the population, calculating a corresponding cost by using a cost function;
moving the candidate time schedules in the search space based on the cost thereof with a Quantum Particle Swarm Optimization approach exploiting a Lévyprobability distribution; and
generating the time schedule based on the candidate time schedules; and
controlling the operation of the house appliances based on the time schedule,
wherein the generating the time schedule includes exploiting a Particle Swarm Optimization approach based on a nature-inspired evolutionary flight.

14. The computer readable medium according to claim 13, wherein the software program, when executed by the processor, further causes the processor to perform operations further comprising:
selecting a candidate time schedule global best position in the search space among positions previously taken by the plurality of candidate time schedules in the search space based on the cost thereof, and
for each candidate time schedule, moving the candidate time schedule by:
selecting a candidate time schedule personal best position in the search space among positions previously taken by such candidate time schedule in the search space based on the cost thereof, and
moving the candidate time schedule based on the candidate time schedule global best position and based on its candidate time schedule personal best position.

15. The computer readable medium according to claim 14, wherein the moving the candidate time schedule from a current position in the search space to a new position in the search space comprises:
calculating a personal attractor position in the search space based on the candidate time schedule personal best position and based on the candidate time schedule global best position, and
setting the new position in the search space based on the personal attractor position and based on a difference between:
a) the personal attractor position, and
b) the current position,
multiplied by a random number with Lévy distribution.

* * * * *